(12) United States Patent
Greengard et al.

(10) Patent No.: US 7,998,538 B2
(45) Date of Patent: Aug. 16, 2011

(54) ELECTROMAGNETIC CONTROL OF CHEMICAL CATALYSIS

(75) Inventors: Leslie Frederick Greengard, New York, NY (US); Mark Brongersma, Redwood City, CA (US); David A. Boyd, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 1284 days.

(21) Appl. No.: 11/012,393

(22) Filed: Dec. 14, 2004

(65) Prior Publication Data

US 2005/0202185 A1 Sep. 15, 2005

Related U.S. Application Data

(60) Provisional application No. 60/529,869, filed on Dec. 15, 2003.

(51) Int. Cl.
*C23C 8/00* (2006.01)
*C23C 16/00* (2006.01)

(52) U.S. Cl. ........ 427/585; 427/551; 427/553; 427/572; 427/573; 427/581; 118/724; 204/157.41; 204/157.47; 548/498

(58) Field of Classification Search ................... 118/724; 427/585, 551, 553, 572, 573, 581; 585/899; 204/157.41, 157.47; 548/498; 564/302
See application file for complete search history.

(56) References Cited

U.S. PATENT DOCUMENTS

| | | | |
|---|---|---|---|
| 2,981,877 A | | 4/1961 | Noyce |
| 3,719,454 A | * | 3/1973 | Shang .......................... 422/127 |
| 5,147,611 A | | 9/1992 | Stout et al. |
| 5,165,909 A | | 11/1992 | Tennent et al. |
| 5,395,663 A | | 3/1995 | Tabata et al. |
| 6,765,949 B2 | * | 7/2004 | Chang ................................. 373/2 |
| 7,088,449 B1 | * | 8/2006 | Brongersma .................. 356/445 |
| 2002/0015150 A1 | * | 2/2002 | Armstrong et al. ........... 356/301 |
| 2002/0112814 A1 | | 8/2002 | Hafner et al. |
| 2002/0127170 A1 | | 9/2002 | Hong et al. |
| 2002/0160111 A1 | | 10/2002 | Sun et al. |
| 2002/0175163 A1 | * | 11/2002 | Fagrell .......................... 219/709 |

(Continued)

FOREIGN PATENT DOCUMENTS

JP 10-256257 9/1998

OTHER PUBLICATIONS

Haruta, Novel catalysis of gold deposited on metal oxides, Catalysis Surveys of Japan, 1 (1997) 61-73.*

(Continued)

*Primary Examiner* — Prem C Singh
(74) *Attorney, Agent, or Firm* — Kilpatrick Townsend & Stockton LLP

(57) ABSTRACT

The present disclosure relates to methods and systems that provide heat, via at least Photon-Electron resonance, also known as excitation, of at least a particle utilized, at least in part, to initiate and/or drive at least one catalytic chemical reaction. In some implementations, the particles are structures or metallic structures, such as nanostructures. The one or more metallic structures are heated at least as a result of interaction of incident electromagnetic radiation, having particular frequencies and/or frequency ranges, with delocalized surface electrons of the one or more particles. This provides a control of catalytic chemical reactions, via spatial and temporal control of generated heat, on the scale of nanometers as well as a method by which catalytic chemical reaction temperatures are provided.

18 Claims, 7 Drawing Sheets

U.S. PATENT DOCUMENTS

2003/0174384 A1  9/2003  Halas et al.
2004/0079195 A1  4/2004  Perry et al.

OTHER PUBLICATIONS

Takeuchi et al, Colloidal stability of gold nanoparticles in 2-propanol under laser irradiation, Jl. Phy. Chem., B, 1997, 101, 1322-1327.*

G Chen, Nonlocal and Nonequilibrium Heat Conduction in the Vicinity of Nanoparticles, Journal of Heat Transfer, Aug. 1996, pp. 8 (539-545), vol. 118; No. 3, American Society of Mechanical Engineers.

Michael C. Wanke*; Olaf Lehmann†; Kurt Müller; Qingzhe Wen*; and Michael Stuke, Laser Rapid Prototyping of Photonic Band-Gap Microstructures, Article, Feb. 28, 1997, pp. 3 (1284-1286)vol. 275, http://www.sciencemag.org.

Joachim P. Spatz; Stefan Mössmer; Christoph Hartmann, Martin Möller*; Thomas Herzog; Michael Krieger; Hans-Gerd Boyen; Paul Ziemann and Bernd Kabius, Ordered Deposition of Inorganic Clusters from Micellar Block Copolymer Films, Journal, Web publication date Nov. 10, 1999, pp. 9 (407-415), © 2000 American Chemical Society.

Stefan A Maier; Mark L. Brongersma; Pieter G Kik; Sheffer Meltzer; Ari A. G. Requicha and Harry A. Atwater*, Plasmonics—A Route to Nanoscale Optical Devices**, Article, Oct. 2, 2001, pp. 5 (1501-1505), No. 19, © Wiley-VCH Verlag GmbH, D-69469 Weinheim, 2001.

J.J. Mock; M Barbic[a)]; D.R. Smith, D.A. Schultz and S. Schultz[b)], Shape Effects in Plasmon Resonance of Individual Colloidal Silver Nanoparticles, Journal of Chemical Physics, pp. 5 (6755-6759)vol. 116; No. 15, © 2002 American Institute of Physics.

Linlin Zhao; K. Lance Kelly and George C. Schatz*, The Extinction Spectra of Silver Nanoparticles Arrays: Influence of Array Structure on Plasmon Resonance Wavelength and Width, Journal, Web publication date May 1, 2003, pp. 8 (7343-7350), vol. 107; No. 30 © 2003 American Chemical Society.

Tolga Atay; Jung-Hoon Song and Arto V. Nurmikko*, Strongly Interacting Plasmon Nanoparticle Pairs: From Dipole-Dipole Interaction to Conductively Coupled Regime, Nano letters, Received date May 25, 2004, pp. 5 (1627-1631), vol. 4 No. 9 © 2004 American Chemical Society.

Viktor K. Pustovalov*, Theoretical Study of Heating of Spherical Nanoparticle in Media by Shorter Laser Pulses, Journal, pp. 6 (103-108), © 2004 Elsevier B.V.

Hirsch et al., Nanoshell-Mediated Near-Infrared Thermal Therapy of Tumors Under Magnetic Resonance Guidance, PNAS, 2003, v. 100, No. 23, pp. 13549-13554.

Ya-Ping Sun et al., "Quantum-Sized Carbon Dots for Bright and Colorful Photoluminescence," J. Am. Chem. Soc., vol. 128, pp. 7756-7757 (2006).

* cited by examiner

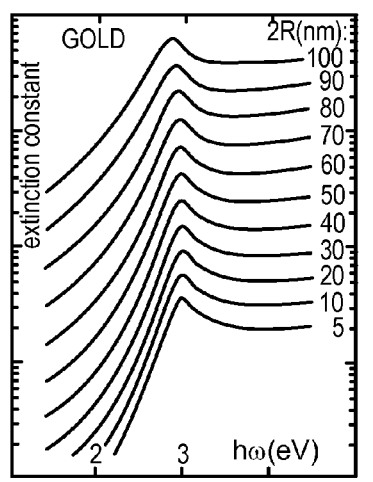
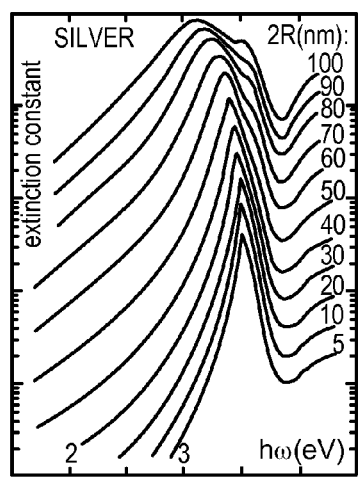
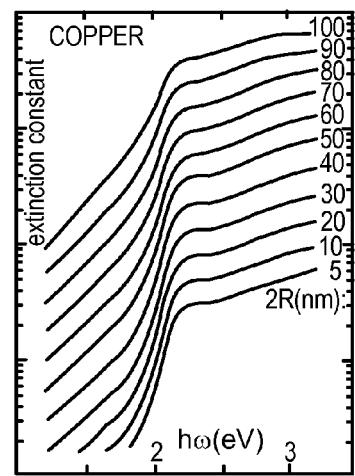
*FIG. 7A*  *FIG. 7B*  *FIG. 7C*

ELECTROMAGNETIC CONTROL OF CHEMICAL CATALYSIS

RELATED APPLICATIONS

This application claims benefit of and priority to U.S. Provisional Patent Application No. 60/529,869, filed Dec. 15, 2003 entitled "Process of Chemical Vapor Deposition of Arrayed Nanostructures: Photon-Electron Assisted CVD", herein incorporated by reference in its entirety.

BACKGROUND

1. Field

The present disclosure is directed to localized heating of micro or nanostructures and their associated methods of use and applications. More particularly and in one aspect, the teachings disclosed herein also provides very localized heating of specific nano and micro structures for the purpose of influencing a catalyzed chemical reaction. In one aspect providing heat for a chemical reaction that takes place on and/or adjacent to a provided structure or plurality thereof which generate heat as a result of at least a Photon-Electron resonance, as taught herein.

2. Related Art

The use of catalysis in large-scale, continuous chemical processes is well known. Many catalytic reactions have a temperature threshold. Prior art methods typically utilize macroscopic heat sources to provide heat for such reactions and typically entail gross convection, gross conduction, or gross radiation. Examples of such macroscopic heat sources are heat strips, ovens, lamps, or heated gasses.

Inherent with the use of such conventional methods of heating, is the difficulty of having control of the temperature of a catalyst, the vicinity of the catalyst and/or the heat applied, both temporally and spatially. For example, it may be desirable to have a reaction take place for a predetermined time that is considerably less than that determined by the time constants associated with a surrounding vessel or substrate in which, or on/adjacent which, such reactions are to take place, respectively. For example, if one were able to provide required heat at very small, particular areas/locations and not heat the surrounding vessel and/or chamber and/or substrate, this would allow much greater temporal control over the temperatures utilized and of the catalyst, i.e. reaction times could be significantly shortened because the thermal mass of the vessel or substrate can be neglected. It also may be desirable to localize the reaction spatially on the order of nanometers and/or microns.

The heat that is generated when coupling photons to metal nanoparticles can be derived as follows: The polarizability, $\alpha$, of a small metallic sphere of radius, R, can be shown to be:

$$\alpha = 4\pi\varepsilon_0 R^3 \frac{\varepsilon - \varepsilon_m}{\varepsilon + 2\varepsilon_m}$$

where $\varepsilon_0$ is the free space dielectric constant, $\varepsilon$ is the dielectric constant of the particle, and $\varepsilon_m$ is the dielectric constant of the nanoparticle. A resonance occurs for a time-varying, spatial stationary field when the following conditions is met:

$$[\varepsilon_{real}(\omega)+2\varepsilon_m]^2+[\varepsilon_{img}(\omega)]^2=\text{Minimum}.$$

This condition can be satisfied with noble metals, and corresponding nanostructures are known to have strong absorptions related to Photon-Electron resonances in the visible portion of spectrum. "U. K. Kreibig and M. Vollmer's, *Optical Properties of Metal Clusters*. Springer-Verlag., New York, 1995" herein incorporated by reference in its entirety. Near the resonant frequency there is nearly an order of magnitude increase in absorption. If a particles is completely absorbing at the appropriate resonance frequency, a simple Stefan-Boltzman calculation, Power/area=$\sigma T^4$, where $\sigma$ is the Stefan-Boltzman constant, can estimate the necessary power to achieve a selected particle temperature.

From the above, it is seen that localized nanoscale reactions are a desideratum and further, for associated apparatus, structures, methods and systems that can be utilized for and in a variety of applications and fields.

SUMMARY

According to one aspect of the disclosure, techniques directed to chemical processes is provided. Providing micro or nanostructures and their applications is also provided. The present invention may be used for other fields and applications such as life sciences, chemistry, material sciences, nano technology, electronics and others.

In some exemplary implementations, temperature affected chemical reactions are facilitated by selected localized heat provided by at least Photon-Electron interactions, sometimes also referred to in the literature and known in the art as plasmon resonance.

As but one example and in one implementation, the present disclosure provides for Photon-Electron assisted chemical vapor deposition (PACVD) which utilizes heat generated by Photon-Electron interactions in nanometer sized structures as the heat source to initiate or facilitate catalytic chemical reactions associated with the deposition of material.

In some exemplary implementations, a reaction product can simply be a heated reactant that is heated by Photon-Electron interactions in accordance with the teachings of the present disclosure. A reactant heated in this manner can be utilized in additional steps/and or processes if so desired. In particular and in accordance with teachings provided herein, application of particular pre-determined frequencies and/or frequency ranges of electromagnetic radiation excite at least a Photon-Electron resonance at the nanometer sized structures and controls the heating and relative temperature of nanometer sized structures by which chemical reactions occur.

In some exemplary implementations a laser provides the electromagnetic radiation utilized to excite at least a Photon-Electron resonance.

In some exemplary implementations, the present disclosure provides for the use of light sources such as a laser source and conventional optics to provide the desired electromagnetic radiation which selectively drives the Photon-Electron resonance to heat the nanometer sized structures utilizing substantially lower power densities than are typically utilized by the prior art to heat material thereby encouraging, facilitation and/or initiating a reaction.

Some exemplary implementations allow for spatial control of chemical processing, such as chemical synthesis, deposition, and/or degradation upon a catalytic substrate on a scale of nanometers. This also provides for a high degree of temporal control of the temperature of the processes/reactions. Stopping incident electromagnetic radiation flux to the nanometer sized structures results in very rapid lowering of temperature at the nanometer sized structures, i.e. a previously established Photon-Electron resonance of these structures attenuates/diminishes, as does the associated generated localized heat.

Techniques using micro or nanostructures for electromagnetically controlled chemical catalysis are provided. More particularly, the teachings disclosed herein provide methods, systems, and resulting structures for enhancing chemical reactions via a catalysis based on a combination of known catalytic microstructures and heating/temperature control based on electromagnetically driven Photon-Electron interactions.

In an exemplary implementation, the method includes providing reactant or reactants, such as, but not limited to, a reactive species (e.g., Ti (2,2,6,6-tetramethyl-3,5-heptanedione, $SiH_4$, and $GeH_4$ adjacent to one or more particles and irradiating the one or more particles with electromagnetic radiation (e.g., from a laser source, or other source) which has a pre-selected frequency, i.e. substantially matches or matches the Photon-Electron resonance frequency or "P-ERF" of the surface electrons of the one or more structures, here for example, a particle or plurality of particles. The term "adjacent" is taken to include actual contact between one object and another. A reactant can be any element or compound that can undergo or be part of a reaction that occurs as a result of exposure to heat provided by the excitation of at least Photon-Electron resonance, as disclosed herein. Increases in temperature of the one or more particles to at least a selected temperature (e.g., reaction temperature) results from an influence of at least the electromagnetic radiation having the pre-selected frequency. The method causes a chemical reaction of the reactant from at least the increase in the temperature of the one or more particles.

In an exemplary implementation, the present disclosure provides an alternative method for accelerating a catalytic chemical reaction using electromagnetic radiation. The method includes providing one or more particles. Preferably, the one or more particles have a thermal characteristic. The method includes applying at least one reactant adjacent and/or on one or more particles and irradiating the one or more particles with electromagnetic radiation which has a pre-selected frequency. The method includes increasing a temperature of the one or more particles having the thermal characteristic to at least a selected temperature from an influence of at least the electromagnetic radiation having the pre-selected frequency and causing a catalytic chemical reaction of the at least one reactant from at least the increase in the temperature of the one or more particles. That heat may be used for other processes such as to initiate formation of a reaction product.

In some exemplary implementations, the particles heated through irradiation and Photon-Electron interactions can themselves be the catalytic agent in the enhanced chemical reaction process. In other exemplary implementations, multiple particles may be used together; some of these particles may be used to cause a localized temperature increase through the aforementioned Photon-Electron interactions, while others act as the catalytic particles, which enhance the desired chemical reaction at a suitable temperature or temperature range. The benefits of spatial and temporal control may apply in one or in both cases.

Still further, the present disclosure provides a method for forming a reaction product utilizing heat generated by at least Photon-Electron resonance of provided structures, in some implementations, disposed in a particular manner upon a substrate. The exemplary method includes providing a substrate comprising a pattern of at least one or more structures preferably one or more nanostructures, which is made of a selected material. The method includes determining a P-ERF of the selected material of the nanostructure and exciting at least portion of the selected material using an electromagnetic source providing electromagnetic radiation having a predetermined frequency at or substantially overlapping with the P-ERF to cause generation of, and an increase in, thermal energy of the selected material. The method includes providing at least one reactant overlying/adjacent the substrate and the selected material excited at the P-ERF and causing production of a desired reaction product, depending upon at least the provided reactant or reactants.

Depending upon the implementation, the present disclosure also provides one or more of the following exemplary features, which are further described throughout the present specification and more particularly below.

1. A method using Photon-Electron excitation in metallic nanostructures as a means for creating local temperature profiles or inducing localized heating which is sufficient to initiate chemical reactions.

2. Photon-Electron excitation in metallic nanostructures to locally heat a structure, such as a pre-form, in a determined space, according to exemplary implementations is also disclosed. A brief sequence of steps can be provided as follows:

a. Developing and/or providing at least one metallic nanostructures upon a substrate (a pre-form), such as, but not limited to, an array of palladium or gold particles by any effective means, including but not limited to electron beam lithography, precipitation and nano-imprinting.

b. Computing and/or utilizing the P-ERF (e.g., or frequency range) for given selected material, spacing, particle size, etc of the metallic nanostructures.

c. Using a light source of appropriate frequency and/or frequency range and sufficient intensity to induce Photon-Electron resonance heating in each of the at least one nanostructures. This can be accomplished by using a focused or a diffuse source which can excite all metallic nanostructures simultaneously.

d. Carrying out step (c) inside a determined space so that at least one reactant such as, for example, vaporized chemical precursors, is provided and is in contact with heated metallic nanostructures, which catalyze a chemical reaction.

Controlling the electromagnetic radiation source can be used to at least turn on/off heating. Heating is induced more rapidly and dissipates more rapidly since it is the interaction of incident electromagnetic radiation with the metallic nanostructures that establishes, via at least Photon-Electron resonance, localized heating of the metallic structures and not the whole of the substrate. Removing the incident electromagnetic radiation flux, having the appropriate frequency or range of frequencies, from the metallic structures results in very fast cooling of the metallic structures due to the small size/mass of the metallic structures.

Depending upon the implementation, one or more of these features may be included. Of course, one of ordinary skill in the art would recognize many variations, modifications, and alternatives. In particular, it should be clear that varied types of particles, nanoparticles or nanostructures could be used in the same process. Some particles or nanostructures could be used to control temperature in the manner indicated above, but not to have catalytic activity. Other particles could be present on the pre-form which act as catalysts when the appropriate temperature is reached.

Additionally, some exemplary implementations provided herein integrates with and provide processes and apparatus that are compatible with conventional fabrication/process technology without substantial modifications to equipment. Preferably, the teachings disclosed herein provide for an improved process integration for design rules of nanometers and less. These and other benefits will be described in more throughout the present specification and more particularly below.

In some exemplary implementations, the specific localized heating of the structures, such as nanostructures, results from at least the excitation of a Photon-Electron resonance. In other implementations, specific localized heating of these structures occurs as a result of other effects or combination of effects resulting from impingement of electromagnetic radiation onto the structures, resulting in heat generation to a desired temperature. Exemplary effects that result in the localized heating of the present invention can include excitation of a Photon-Electron resonance, phonon lattice vibrations, electron hole creation/dynamics and Landau damping, or any combination thereof.

In one aspect, the teachings of the present disclosure provide a method facilitating chemical reactions utilizing localized heating, comprising the steps of providing a substrate having disposed thereon at least one structure, introducing at least one reactant adjacent the at least one structure and irradiating the at least one structure with electromagnetic radiation. In some implementations, a plurality of structures is provided. The electromagnetic radiation has a pre-determined frequency or range of frequencies that is absorbed by the at least one structure and preferentially excites at least a Photon-Electron resonance of the at least one structure. This provides and generates localized heat, from the at least one structure and as a result of at least the Photon-Electron resonance, and raises the temperature to facilitate at least one catalytic chemical reaction involving the at least one reactant, which provides at least one reaction product.

In some implementations at least one structure is provided upon said substrate in a desired configuration to provide a pre-form, which determines the locality where the at least one catalytic chemical reaction takes place. The pre-form can include a plurality of structures or one structure, where the at least one structure or plurality has, for example, a form selected from the group consisting of a particle, a dot, a sphere, a wire, a line, a film and any combination thereof. In some implementations, the particle, dot, sphere, wire, line, film and any combination thereof have nano-scale dimensions (any one or combination of height, length, width, diameter, radius, diagonal etc. . . . ). In some implementations, the particle and/or sphere can have a radius from about 0.5 to about 500 nanometers, or from about 1 to 100 nanometers.

In some exemplary implementations, the at least one structure is or contains at least one metal. The metal can be one of gold, copper, silver, titanium, aluminum, nickel, palladium, platinum, ruthenium, iridium, iron, cobalt, rhodium, osmium, zinc or any combination thereof. The at least one metal can act as a catalyst in the at least one chemical reaction and/or act as a localized heating source to provide heat at a reaction temperature. In some exemplary implementations, the at least one reactant can be a gas, a liquid, a plasma, a solid or any combination thereof.

In some exemplary implementations, the at least one structure is or contains at least one element, or combination of elements as found in the Periodic Table of the elements or any combination thereof. The at least one structure can act as a catalyst in the at least one chemical reaction and/or act as a localized heating source to provide heat at a chemical reaction temperature. In some exemplary implementations, the at least one reactant can be a gas, a liquid, a plasma, a solid or any combination thereof.

In some exemplary implementations, the at least one chemical reaction involving the least one reactant can be, for example, a decomposition reaction where the at least one reaction product is or contains a component of the at least one reactant. In some implementations, the at least one reactant is a compound having a particular ratio of elements, where the at least one reaction product has the same ratio of elements as the compound and the at least one chemical reaction results in a change of at least one characteristic of the compound. Exemplary changes include, for example, a re-arrangement of atoms, change in bond number, change in bond type, change in bond angle. In some implementations, the reaction brings about a change of at least one characteristic resulting in isomer production of the at least one reactant. In some implementations, such isomer production can result in the production of enantiomers.

In some exemplary implementations, the at least one chemical reaction involving the least one reactant can be, for example, any of a substitution reaction, an addition reaction, an elimination reaction, a condensation reaction or any combination thereof. In some implementations, the at least one reactant combines with at least a second reactant to form a reaction product.

The electromagnetic radiation utilized in some implementations is in the form of a laser provided by a laser source. Various laser sources and lasers can be utilized in accordance with the present disclosure. Electromagnetic radiation, for example, can be ultraviolet, visible or infrared radiation or any combination thereof. In some implementations, provided electromagnetic radiation irradiates at least a portion of the substrate.

In one aspect, the present disclosure provides methods wherein the at least one reactant is a carbon containing compound. In certain implementations, at least a second reactant is provided, wherein the at least one reactant is a carbon containing compound and the second reactant is a hydrogen containing compound In some exemplary implementations, the substrate is comprised of silicon, or Group III/V materials or silicon on insulator or germanium or quartz or glass or any combination thereof.

In some exemplary implementations, electromagnetic radiation having the pre-determined frequency or range of frequencies is directed upon a plurality of structures or a subset of the plurality of structures. The plurality of structures can comprise at least a first subset and a second subset of structures, each subset differing in composition from another subset. In one implementation, the first subset heats up to a first reaction temperature that is a result of the interaction of the provided electromagnetic radiation irradiation with the first subset, to drive at least one catalytic chemical reaction. In an additional exemplary step, additional electromagnetic radiation is provided, wherein the additional electromagnetic radiation has a pre-determined frequency or range of frequencies that differs from the electromagnetic radiation previously provided and excites at least a Photon-Electron resonance in the second subset of structures and thus provides heat for an additional reaction.

The present disclosure also provides methods and apparatus wherein localized heat is provided, at least in part, by at least one of phonon lattice vibrations, electron hole creation/dynamics, Landau damping, or any combination thereof, in addition to said Photon-Electron resonance to provide disclosed heat.

The present disclosure also provides for exemplary apparatus for Photon-Electron assisted deposition. In some exemplary implementations, such apparatus include a determined space, at least one inlet in communication with the determined space for conducting at least one reactant into the determined space, a substrate having disposed thereon at least one structure, the substrate being located within the determined space. A source of electromagnetic radiation is also provided, positioned to irradiate the substrate with electromagnetic radiation having a pre-determined frequency or range of frequencies, that is absorbed by the at least one structure and excites at least a Photon-Electron resonance of the at least one structure. In some implementations, the electromagnetic radiation is provided such that it irradiates at least a portion of the substrate having the at least one structure disposed thereon. This provides localized heat, from the at least one structure and as a result of at least Photon-Electron resonance, at a temperature to facilitate at least one catalytic chemical reaction involving the at least one reactant. The apparatus further comprises and at least one outlet in communication with the determined space. The at least one outlet can be for conducting at least one reaction product from the determined space. Some implementations can include a second inlet in communication with the determined space and/or a second outlet from the determined space.

In some exemplary implementations of the apparatus, the least one structure contains at least one metal such as, but not limited to, any one of gold, copper, silver, titanium, aluminum, nickel, palladium, platinum, ruthenium, iridium, iron, zinc and any combination thereof. The at least one structure has a form/shape that can be any one of a particle, a dot, a sphere, a wire, a line, a film and any combination thereof. As discussed above, some implementations of the apparatus utilize at least one structure having a shape/form such as a particle, dot, sphere, wire, line, film and any combination thereof, having nano-scale dimensions. Exemplary dimensions, such as height, width, thickness, etc can be anywhere from 0.5 to 500 nanometers. Some implementations utilize such structures having dimensions of 1 to 100 nanometers, and still others of 10 to 50 nanometers, or thereabouts or any range therebetween.

Depending upon the implementation, the at least one metal of the at least one structure can be a catalyst in the at least one deposition reaction and/or acts as a heat source for the reaction. Exemplary at least one reactant can be any one or any combination of gas, liquid, plasma or solid.

Various additional objects, features and advantages of the present invention can be more fully appreciated with reference to the detailed description and accompanying drawings that follow.

BRIEF DESCRIPTION OF THE DRAWINGS

FIGS. 7A-7C are calculated Mie extinction spectra of monodisperse spherical clusters of gold, silver, and copper, respectively. Parameter is the size 2R.

DETAILED DESCRIPTION OF THE INVENTION

Figure 1:
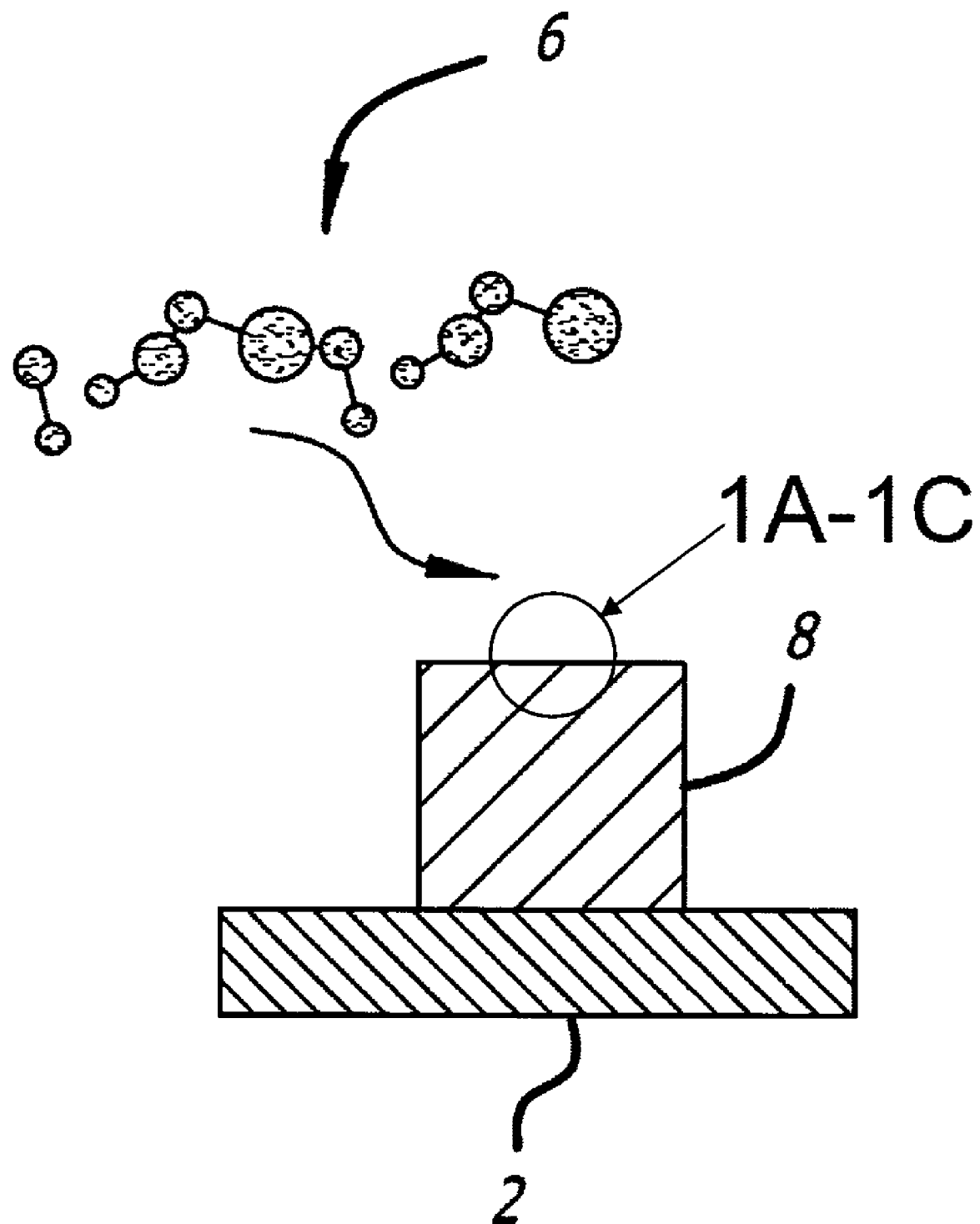
FIG. 1 is an illustrative structure and at least one reactant.

Descriptions of exemplary implementations are provided and reference made to the accompanying figures which form the part thereof, and which are shown by way of illustration of exemplary implementation of teachings provided herein. It is to be understood that other implementations and application of the teachings provided herein may be utilized and structural and functional changes may be made without departing from the spirit and scope of the present disclosure. Additionally, the figures are for illustrative purposes and no relative or limiting sizes, scales or ratios are intended.

Techniques directed to micro or nanostructures and their applications are provided. More particularly and in one aspect, the teachings disclosed herein provide methods, systems and resulting structures and their use for forming nano and micro structures using novel deposition techniques useful for a wide variety of applications. As merely an example, such deposition techniques can be applied to formation of one or more films in the manufacture of electronic devices, such as integrated circuit, memory media, storage media both volatile and non-volatile. It would be recognized that the invention has a much broader range of applicability. The generation of heat via at least Photon-Electron resonance excitation of dissociated surface electrons by incident electromagnetic radiation of particular structures, such as but not limited to particles, rods, wires, spheres and the like, can be utilized in and for various manufacturing techniques, particularly nano-scale manufacturing, chemical processing and other uses where very localized heat generation is desired.

In accordance with some implementations, the size of such structures, which will provide/generate heat upon exposure to electromagnetic radiation as described herein and in accordance with the teachings disclosed, can have dimensions of about 0.5 to about 500 nanometers, preferably from about 1 to 100 nanometers, or any specific range therebetween where at least a Photon-Electron resonance can be provided that provides heat at a desired temperature, such as a reaction temperature.

In one implementations, a method for fabricating a film of material using a Photon-Electron assisted process according to an implementation of the present invention may be outlined as follows:

A substrate having a surface region is provided, onto which is disposed a metallic structure, preferable a metallic nanostructure. In this implementation, this metallic structure can be one or more particles having a particular thermal characteristic, e.g. the ability to provide appropriate Photon-Electron resonance upon exposure to appropriate electromagnetic radiation having the appropriate P-ERF or range of P-ERFs. The P-ERF is the frequency at which electromagnetic energy from an electromagnetic wave is efficiently converted into a collective electron motion in a solid structure. The Photon-Electron resonance frequency may be derived by solving Maxwell's equations with the appropriate boundary conditions or it can be measured empirically from a reflection or absorption spectrum. The one of more particles are disposed on at least a portion of the surface region of the substrate. At least one reactant is provided within a vicinity of the one or more particles. The at least one reactant is composed of at least one component, although the reactant can include two or more components. The one or more particles are irradiated with electromagnetic radiation having a pre-selected frequency, in a selected spatial region. The spatial region can be substantially defined by the position of the one or more particles upon the substrate. The impacted spatial region can also include areas of the substrate upon which the one or more particles are not disposed. The spatial region can also include areas less than the areas of the substrate upon which the one or more particles is disposed, e.g. irradiation falls upon some particles but not others at a given time.

The pre-selected frequency of the irradiating electromagnetic radiation is of a frequency concordant/substantially concordant with a P-ERF of the disposed metallic structure, here the one or more particles. This results in an increase in temperature of the one or more particles having the thermal characteristic to at least a selected temperature, from an influence of at least the electromagnetic radiation having the pre-selected frequency. The surrounding substrate does not appreciably heat up relative to the one or more particles disposed thereon. This very specific and localized heating, due to the Photon-Electron resonance occurring as a result of the interaction of the electromagnetic radiation, of pre-selected frequency, with the delocalized surface electrons of the one or more particles, provides the required energy (i.e. heat) to instigate a chemical reaction, which includes at least one reactant, from at least the increase in the temperature of the one or more particles. This initiates a reaction which may be used for the formation/deposition of a film of material based on the at least one reactant.

Metallic structure 8 in FIGS. 1 and 1A-1C are depicted as squares simply for illustrative purposes and can be any desired shape, as previously disclosed. Incident electromagnetic radiation 4 excites a Photon-Electron resonance of metallic structure 8, for example in an array on a substrate 2 in a CVD environment, which includes at least one reactant such as, but not limited to, a vaporized chemical precursor 6.

Figure 1A:
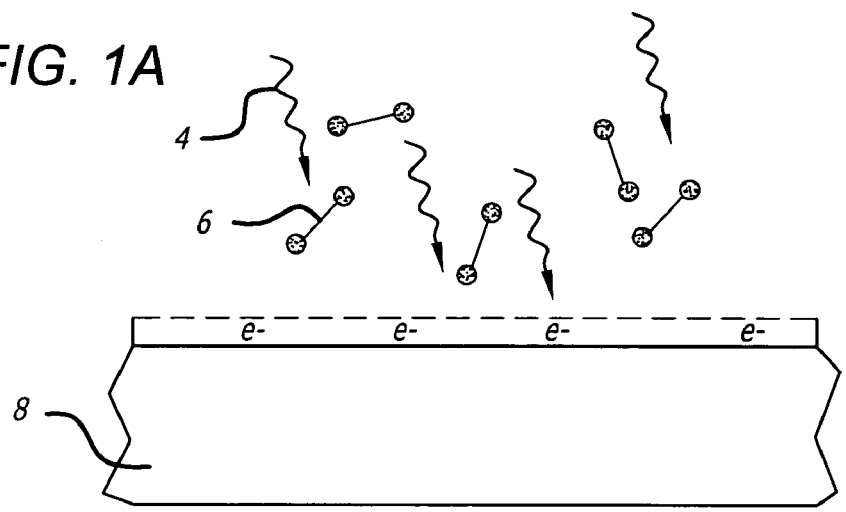
FIG. 1A is an illustrative close-up of a surface of a structure, incident electromagnetic radiation, exemplary surface electrons of the structure's surface and at least one reactant.
Figure 1B:
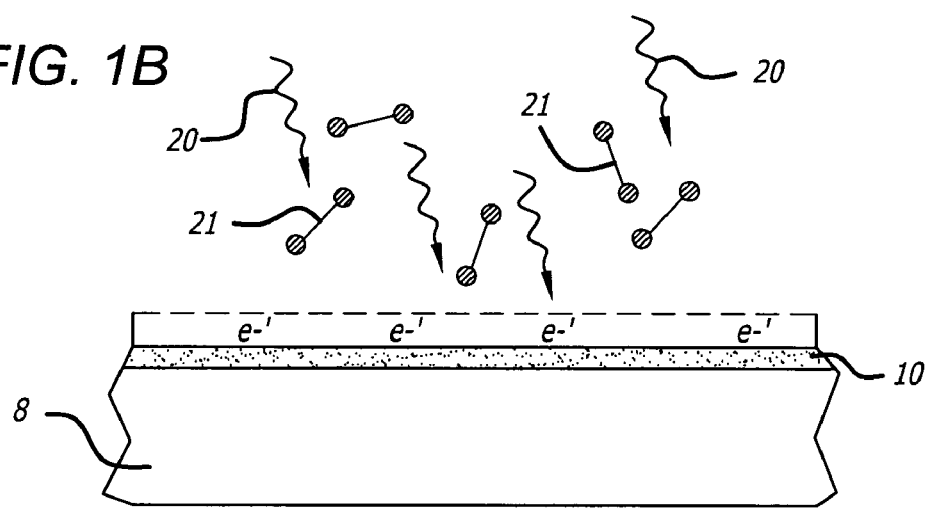
FIG. 1B depicts an exemplary first material layer disposed upon the structure and a second incident electromagnetic radiation, a second reactant and exemplary surface electrons of the deposited exemplary first material layer.
Figure 1C:
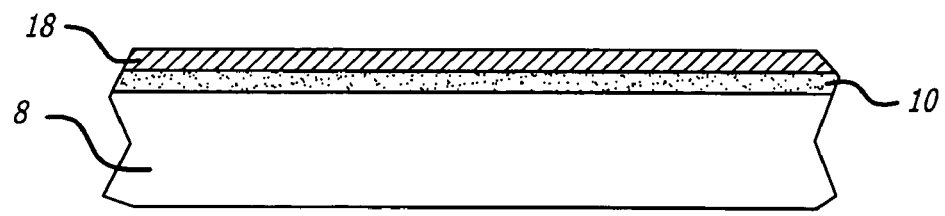
FIG. 1C depicts a second material deposition layer upon the first material layer.

FIGS. 1A-1C are up-close illustrative schematics of the surface of a structure from which heat is generated by photon-electron interactions in nanometer sized structures, in accordance with the teachings disclosed herein. In FIG. 1A and taking as an example metallic structure 8, the dissociated surface electrons are depicted as "$e^-$". Incident electromagnetic radiation 4 having a frequency that is consonant with the Photon-Electron resonance of these surface electrons excites and establishes a Photon-Electron resonance, which in turn generates heat to a reaction temperature at which a reaction between metallic structure 8 and at least one reactant such as a chemical precursors 6 for example and/or between chemical precursors 6 themselves, result in formation of material and deposition 10. In some implementations the at least one structure plays the dual role of a catalyst as well as heat generator. As taught herein, when heat is localized, so may be the chemical reaction and any deposition which may be associated therewith.

Turning to FIG. 1B, material that makes up deposition 10 itself has dissociated surface electrons which are here depicted as $e^-$. A second incident electromagnetic radiation 20 and second reactant, such as a second chemical precursor 21, are introduced. The second incident electromagnetic radiation 20 has a frequency that is consonant with the Photon-Electron resonance of these surface electrons ($e^-$) and excites and establishes at least a second Photon-Electron resonance and associated generated heat. The heating effects from photon-electron interactions in nanoparticles is related to the average kinetic energy of the conduction electrons, and incident electromagnetic radiation will cause oscillations of electrons in the surface region of a metal, thereby increasing the average kinetic energy. The kinetic energy of the surface electrons is eventually transferred in a somewhat random fashion to electrons interior to the surface, namely bulk electrons. This is the basis of radiative heating. If however, the electromagnetic radiation is at or near the P-ERF, there will be collective oscillations or a resonance of the surface electrons, and the heating will be maximized. As the size of a structures decreases, there is an increase in the surface-to-volume, ratio which is proportional to $1/R$, where R is the radius of the particle. Nanoparticles, in particular, have high surface-to-volume ratios so that there are a larger number of surface electrons relative to bulk electrons. It is generally believed that this accounts for the efficient heating of nanoparticles by electromagnetic radiation at the plasmon resonance frequency. The optimal absorption frequency can depend both on the shape of individual nanoparticles as well as the geometric arrangement of a collection of nanoparticles (e.g on a surface). For an individual spherical particle, the calculation of the absorption spectrum dates back to the work of Mie in the early part of the last century. Recent experimental evidence suggests that this heating process can occur on very fast time scales. The heat generated can raise the temperature sufficiently to initiate a chemical reaction. The heat may be applied between deposition 10 and second chemical precursor 21 and/or between second chemical precursors 21 themselves, resulting in a second material formation and deposition 18 upon previously provided deposition 10.

Exemplary metals (which may be used to form metallic structures) such as, Cu, Ag, Au, Ni, Pd, Pt, Rh, and Ir, have absorption resonances in the visible wavelengths due to disassociated surface electrons known as plasmons. By utilizing at least Photon-Electron resonance and associated heating of the metallic nanostructures due to excitation of these surface electrons, it is possible, to heat, with the appropriate wavelength and power of incident light, nanometer sized structures, i.e. nanostructures, such as but not limited to spheres, lines, arrays and rods to temperatures suitable for facilitating deposition reactions including but not limited to material growth.

In some embodiments, the underlying substrate can be comprised of one or any combination of silicon, or Group III/V materials (of the periodic table), silicon on insulator, germanium, or quartz or glass. In any of the cases described herein, provided electromagnetic radiation can be provided at a constant rate and/or pulsed upon the structures to generate heat as a result of at least a Photon-Electron interaction with some components of the structure or plurality of structures. In some embodiments, those components are metal containing nanostructures. Facilitated reactions that provide any number of types of reaction products some of which may be deposited upon substrate 2.

In some implementations, substrate can be comprised of one or any combination of silicon, or Group III/V materials (of the periodic table), silicon on insulator, germanium, or quartz or glass. In any of the instant cases described herein, provided electromagnetic radiation can be provided at a constant rate and/or pulsed upon the structures to generate heat as a result of at least a Photon-Electron resonance of the structure or plurality of structures, in some implementations metal containing nanostructures.

Various chemical reactions can take place on and or adjacent the at least one structure, or plurality of structures (such as an array, for example). Furthermore, the at least one structure which acts as a localized heat source can simultaneously act as a catalyst in at least one chemical reaction. As stated previously, the at least one structure, preferably contains a metal, such as, but not limited to, gold, copper, silver, titanium, aluminum, nickel, palladium, platinum, ruthenium, iridium, iron, cobalt, osmium, zinc, rhodium or any combination thereof. In some implementations, a plurality of nanostructe particles are provided, at least some acting as only heat sources and some acting as only catalytic units. In some implementations where a plurality of structures are provided, at least a first and second subset of structures can be provided. The subsets can be comprised of the same materials and have differing shapes/forms from one another, disposed upon substrate 2 (e.g. an array and a set of wires). Other contemplated implementations include subsets of structures upon a substrate which are comprised of differing materials, providing each subset of structures particular thermal characteristics, e.g. at least Photon-Electron resonances, that provide heat as a result if exposure to particular electromagnetic radiation frequencies or range of frequencies that do not excite at least Photon-Electron resonances in the other subset. This provides specific heat, by a specific subset, for a specific chemical reaction, all happening adjacent the other second subset upon the substrate.

The at least one structure can be provided, as mentioned previously, as a particle, dot, sphere, wire, line, film or any combination thereof, having nano-scale dimensions, that is, having one or any appropriate combination of height, length, width, radius, diagonal, diameter of anywhere from 0.5 to 500 nanometers, preferably between 1 to 100 nanometers or any range therebetween and thereabouts.

Figure 2A:
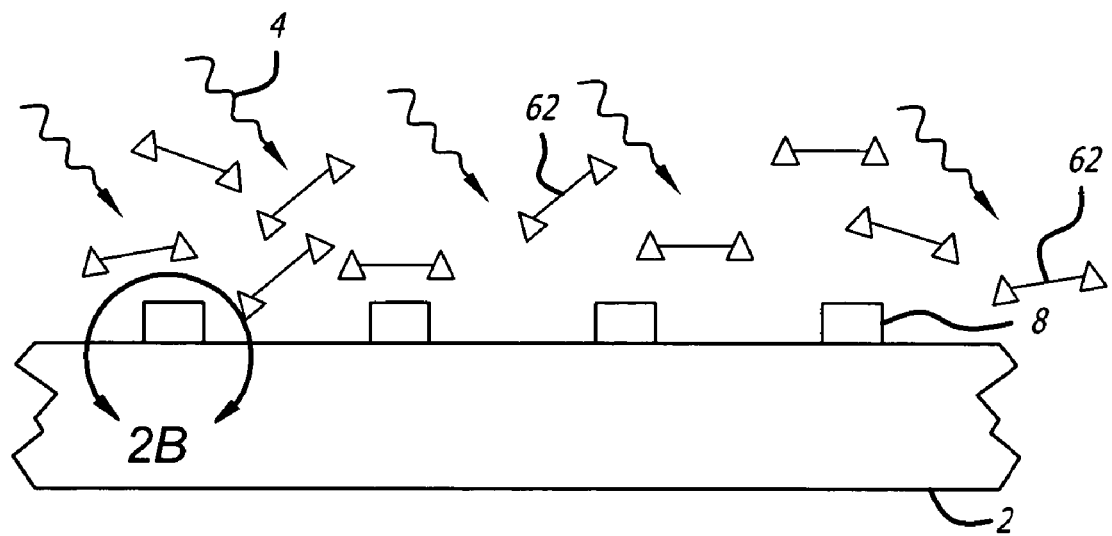
FIG. 2A is a depiction of an exemplary substrate, plurality of structures.
Figure 2B:
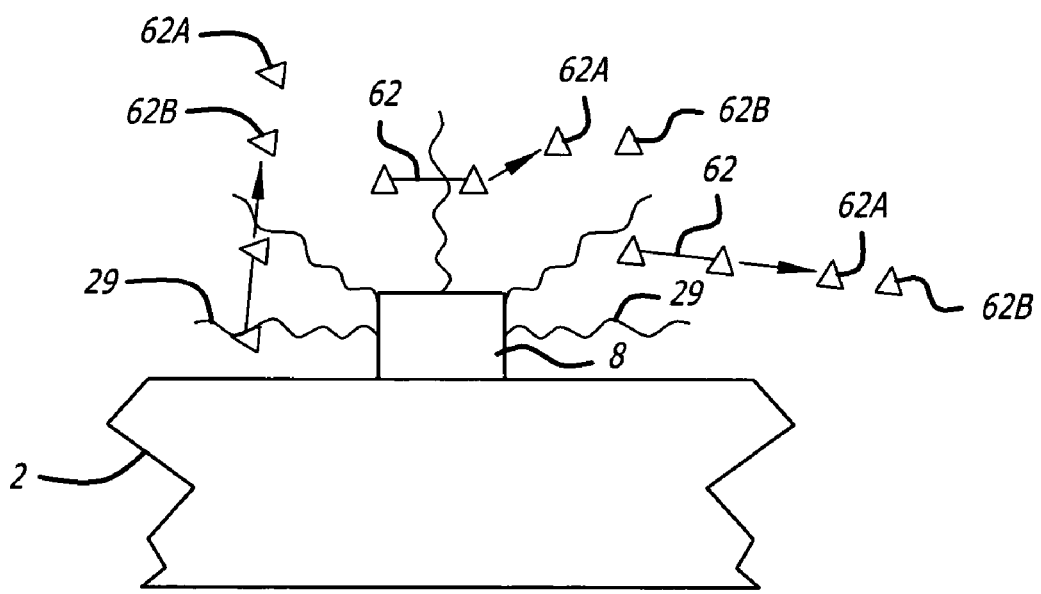
FIG. 2B is a schematic, enlarged view of a structure shown in FIG. 2A and a reactant undergoing an exemplary chemical reaction.

Reactants of exemplary chemical reactions provided in accordance with the present disclosure can be any one or combination of a gas, liquid, plasma or solid. Various types of reactions can be provided in accordance with the present teachings. An exemplary reaction can be a decomposition reaction wherein at least one reaction product is or contains a component of the at least one reactant. This is exemplified in FIG. 2A, where a plurality of metallic structures 8 are depicted on substrate 2, being irradiated by electromagnetic radiation 4 having the pre-determined frequencies or range of frequencies that excite at least a Photon-Electron resonance in each metallic structure 8. Exemplary decomposition reactant 62 is also provided. FIG. 2B is a schematic close-up of a single metallic structure 8, that is generating heat, here depicted as a plurality of wavy line 29, at a chemical reaction temperature as a result of at least the excited Photon-Electron resonance provided as a result of the interaction of metallic structure's 8 Photon-Electron electrons with electromagnetic radiation 4 at the appropriate Photon-Electron resonance frequency or range of frequencies. This increase in temperature occurs adjacent to, upon, and/or in the local vicinity of the catalyst (which may be the metallic structures). Exemplary decomposition reactant 62 undergoes the decomposition and breaks apart into at least two portions 62A and 62B, providing at least one desired reaction product. The exemplary reaction depicted in FIGS. 2A and 2B is sometimes referred to as an elimination reaction, wherein a reactant is eliminated by breakdown into component parts.

Figure 3A:
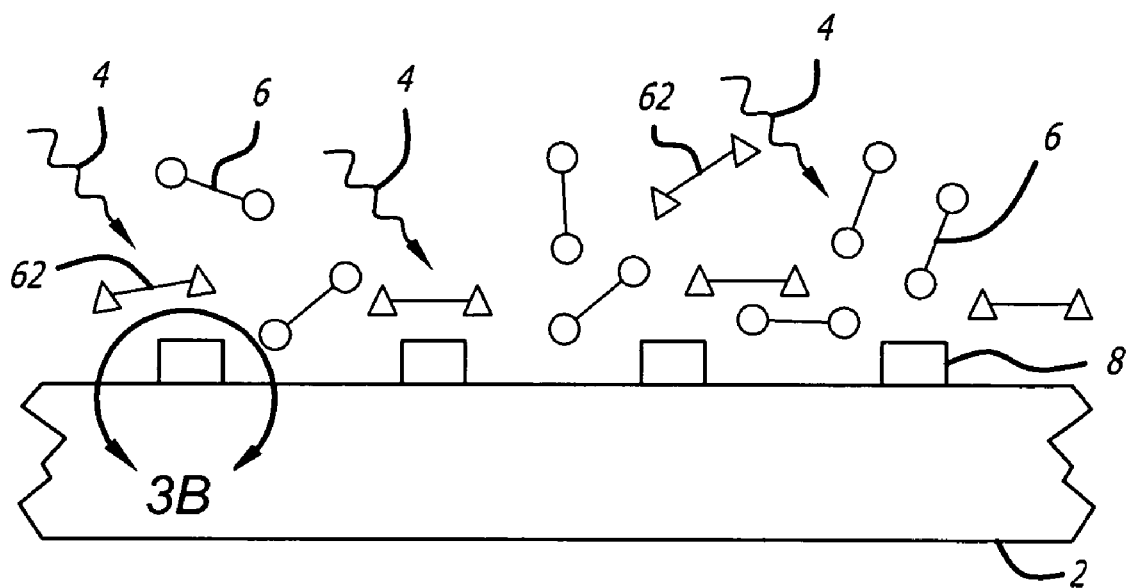
FIG. 3A is a depiction of an exemplary substrate, plurality of structures and two reactants.
Figure 3B:
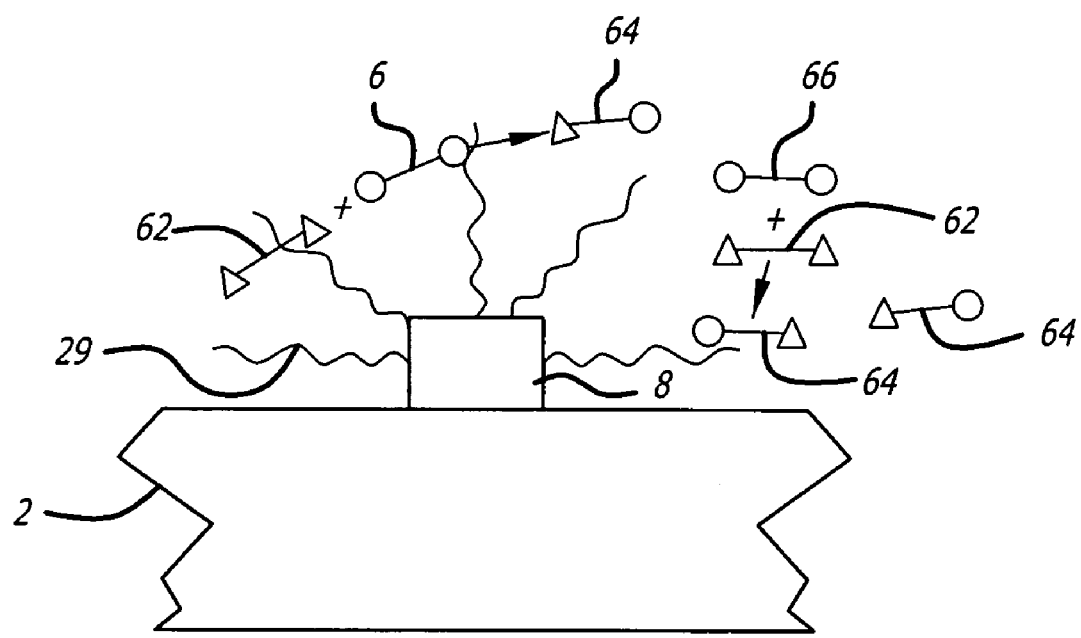
FIG. 3B is a schematic, enlarged view of a structure shown in FIG. 3A and another exemplary reaction.
Figure 5:
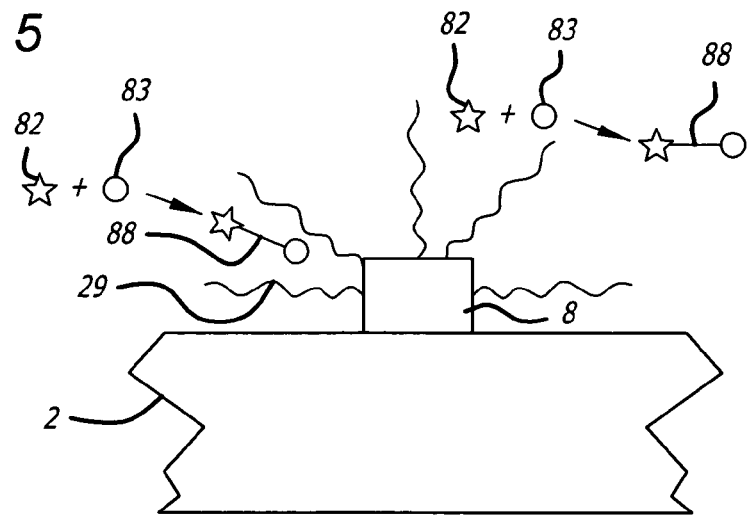
FIG. 5 is a schematic, enlarged view of another exemplary structure, heat and yet another exemplary reaction.

Another exemplary chemical reaction can be a substitution reaction, where the least one reactant reacts with at least a second reactant and substitutes itself or a portion of itself in place of a portion of the second reactant an/or adds to the second reactant to produce a reaction product. This is exemplified in the schematic of FIG. 3A, where in this exemplary implementation, a plurality of metallic structures 8 are provided upon substrate 2. Appropriate electromagnetic radiation 4 is provided to generate heat from the plurality of metallic structures 8 due to at least excitation of a Photon-Electron resonance in plurality of metallic structures 8. Here an exemplary first reactant is symbolized as a connected pair of triangles 62 and a second exemplary reactant is symbolized as a connected pair of circles 6. As shown in the schematic close-up of FIG. 3B, heat 29 provides the desired reaction temperature adjacent to, upon, and/or in the local vicinity of the catalyst (which may be the metallic structures) and at least one chemical reaction takes place. In this example, one of the triangles, which can be a portion of the exemplary first reactant, switches places with one of portion of the second reactant to provide at least one reaction product having a portion of the first reactant and a portion of the second reactant. In FIG. 3B, this is symbolized as the connected circle and triangle 64. In another exemplary reaction, wholesale combination of a first reactant with at least a second reactant can result in an addition reaction product. That is, as exemplarily and symbolically depicted in FIG. 5, where a first reactant, shown as star 82 and a second reactant, shown as circle 83, are added together at the provided chemical reaction temperature to form a reaction product that is an additive combination of the two, here depicted as a pairing of symbols star 82 and circle 83, to provide combination addition reaction product 88.

Figure 4A:
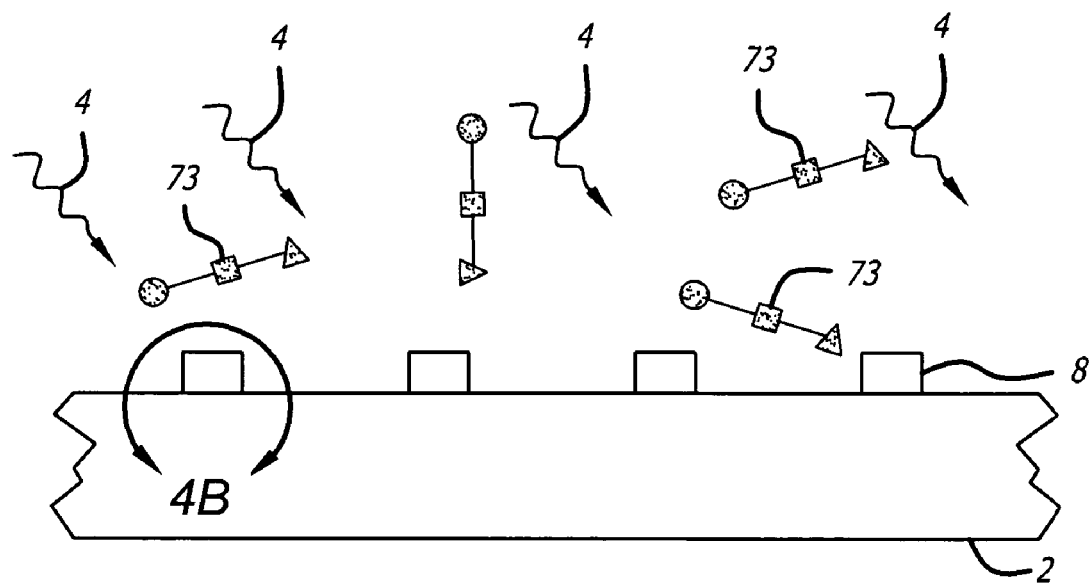
FIG. 4A is a depiction of an exemplary substrate, plurality of structures and a reactant.
Figure 4B:
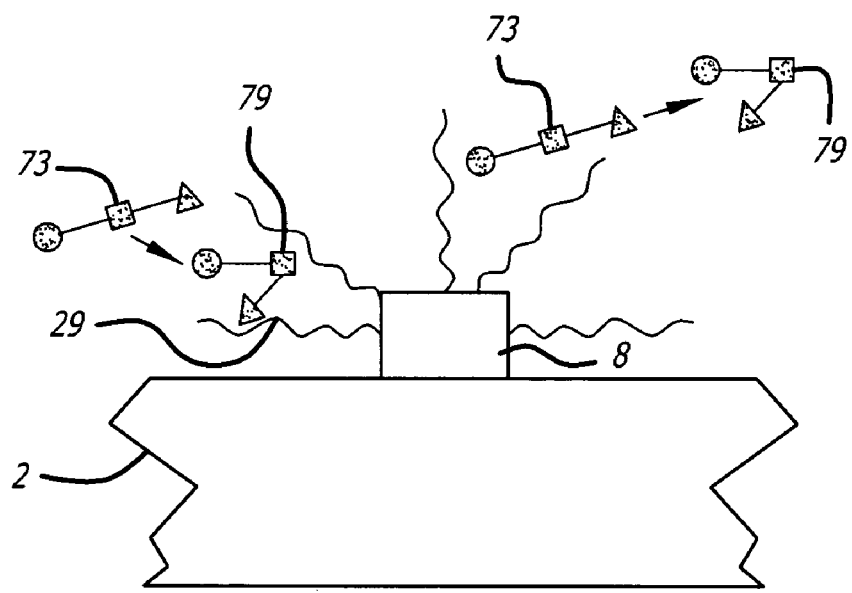
FIG. 4B is a schematic, enlarged view of a structure shown in FIG. 4A and another exemplary reaction.

In some implementations, the at least one reactant of a provided at least one chemical reaction is a starting compound 73 having a particular ratio of elements, as exemplified in FIG. 4A by a circle, square and triangle, symbolizing an exemplary starting compound. As before, appropriate electromagnetic radiation 4 is provided, appropriate heat is generated via at least a Photon-Electron resonance of metallic structure 8 to a chemical reaction temperature and at least one chemical reaction takes place, exemplified in the schematic of FIG. 4B. Here, the at least one reaction and at least one reaction product, indicated as altered compound 79, have the same ratio of elements as starting compound 73 and the at least one chemical reaction results in a change of at least one characteristic of starting compound 73. Exemplary changes include any one of a re-arrangement of atoms, change in bond number, change in bond type, change in bond angle, or any combination thereof. In some implementations, the at least one reaction brings about a change of at least one characteristic of starting compound 73, for example resulting in isomer production of the at least one reactant. In some implementations, such isomer production can result in the production of enantiomers.

Figure 6:
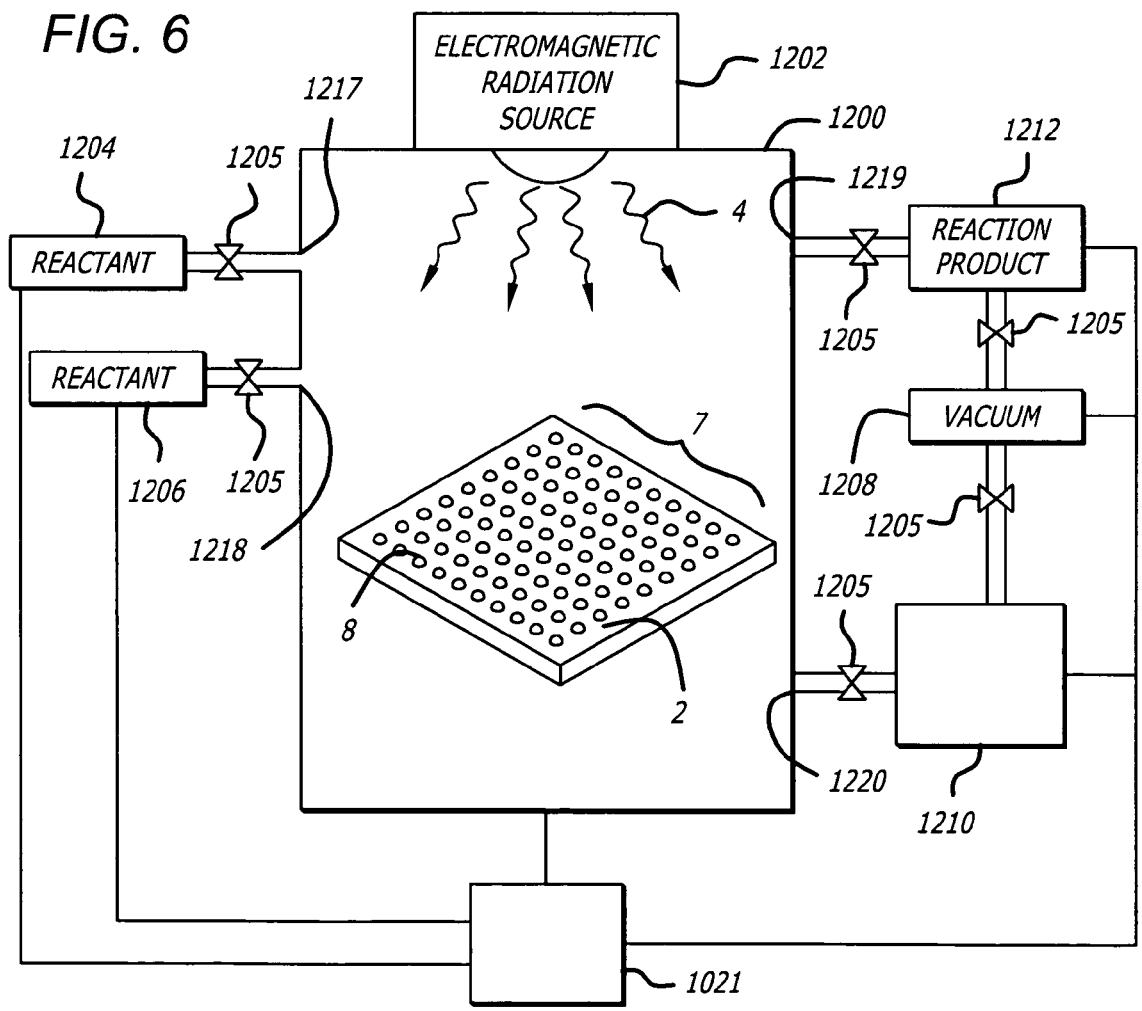
FIG. 6 is a schematic configuration of an exemplary apparatus in accordance with teachings disclosed herein.

An exemplary apparatus in accordance with one aspect of the disclosure is schematically depicted in FIG. 6. In this example, the apparatus includes a determined space 1200, at least one inlet 1217 in communication with determined space 1200 for conducting at least one reactant from at least one reactant supply 1204 into determined space 1200, a substrate 2 having disposed thereon at least one structure, here an array 7 comprising a plurality of a metallic structure 8, for example. Other configurations are contemplated to be within the scope and teachings of the present disclosure. Substrate 2 is located within the determined space and a source of electromagnetic radiation 1202 is also provided. The electromagnetic radiation 1202 source 1202 is positioned to irradiate the substrate having the at least one structure disposed thereon and/or a portion thereof, with electromagnetic radiation having a pre-determined frequency or range of frequencies that is absorbed by the at least one structure, exemplarily shown here as an array 7 having a plurality of a metallic structures 8, and exciting at least a Photon-Electron resonance of the plurality of a metallic structures 8. In some implementations, the electromagnetic radiation 4 is provided such that it irradiates at least a portion of the substrate having the at least one structure disposed thereon. This provides localized heat, from the at least one structure and as a result of at least a Photon-Electron resonance, at a chemical reaction temperature to facilitate at least one chemical reaction involving at least one reactant provided by reactant supply 1204. There is also provided at least one outlet 1219 in communication determined space 1200. The at least one outlet 1219 can be for conducting at least one reaction product from determined space 1200. Some implementations can include a second inlet 1218 in communication with determined space 1200 and a second reactant supply 1206 containing a second reactant. Additionally and in this implementation, an additional outlet 1220 can also be provided, in fluid communication with determined space 1200 and a analyzing apparatus 1210, such a gas chromatograph, for example. Furthermore, a vacuum 1208 can also be provided and can function to collect at least one reaction product and/or to pull reaction products to analyzing apparatus 1210. Of course, appropriate valves 1205 are exemplarily provided as shown in FIG. 6. The overall operation of the apparatus and monitoring and control of reactions in accordance with the teachings provided herein can be provided by at least one computer system 1021, which is in operable communication with various components of the apparatus set up, as exemplarily shown in FIG. 6. Reactants of reactant supplies 1204 and 1206 can be provided to determined space 1200 in a desired state, such as a gas, liquid, solid or plasma, or any combination thereof.

In some implementations of the apparatus, the least one structure, here the plurality of metallic structures 8, contains at least one metal such as, but not limited to, any one of gold, copper, silver, titanium, aluminum, nickel, palladium, platinum, ruthenium, rhodium, iridium, iron, zinc and any combination thereof. The at least one structure has a form/shape that can be any one of a particle, a dot, a sphere, a wire, a line, a film and any combination thereof, as disclosed previously. As discussed above, some implementations of the apparatus utilize at least one structure having a shape/form such as a particle, dot, sphere, wire, line, film and any combination thereof, having nanoscale dimensions. Exemplary dimensions of such structures, such as height, width thickness, diameter, length or any combination thereof, are of about 0.5 to about 500 nanometers. In some implementations the at least one structure has dimensions of about 1 to 100 nanometers, and in still others, of about 10 to 50 nanometers. The overall sizes provide for establishment and utilization of at least a Photon-Electron resonance that provides heat at a desired reaction temperature.

Depending upon the implementation, the at least one metal of the at least one structure is a catalyst in the at least one chemical reaction and/or acts as a heat source for the chemical reaction. Exemplary chemical reaction temperatures can be several hundred Celsius (C) 60 C to 1200 C and thus localized heating, as disclosed and provided by the present teachings can reach such temperatures. In various implementations, by pulsing a laser, for example, it is possible to control chemical reaction times and temperatures. Exemplary apparatus provided herein can host a variety of chemical reactions in accordance with the present disclosure, as discussed above.

In some implementations, exemplary apparatus includes at least one electromagnetic radiation source 1202, can be derived from a laser source, such as, but not limited to, a solid state laser, a semiconductor diode laser, a helium neon gas laser, an argon ion gas laser, a krypton ion gas laser, an xenon ion gas, tunable lasers, and or lamps. Preferably, the pre-selected wavelength ranges from about 100 nm to about 10 μm. Exemplary electromagnetic radiation 4 provided and utilized by exemplary apparatus can include one or any combination of ultraviolet, visible or infrared radiation. The exemplary source of electromagnetic radiation provides pulsed electromagnetic radiation having the pre-determined frequency or range of frequencies.

As described above, electromagnetic radiation utilized in accordance with the present disclosure can be provided by any number of sources such as a laser source or lamp, for example. Electromagnetic radiation 4 can be any one or a combination of ultraviolet, visible or infrared electromagnetic radiation.

The application of electrostatics facilitates the understanding of the optical response of metal clusters with $R \ll \lambda$. The positive charges in the clusters are assumed to be immobile and the negative charges, i.e. the conduction electrons, are allowed to move under the influence of external fields. Therefore a displacement of the negative charges from the positive ones occurs if a metal cluster is placed in an electric field. Using the boundary conditions at the sphere surface, one can calculate the resulting polarization of the sphere as a whole due to the external field. The internal field is $$E_i = E_0 \frac{3\varepsilon_m}{\varepsilon + 2\varepsilon_m}, \quad (2.11)$$

where $\in_n$, is the dielectric constant of an embedding medium. The static polarizability of the sphere which is defined as $p = \in_m \alpha E_0$ is found to be $$\alpha = 4\pi\varepsilon_o R^3 \frac{\varepsilon - \varepsilon_m}{\varepsilon + 2\varepsilon_m}. \quad (2.12a)$$

In the special case of metals we have $\in(0) = -\infty$ and this leads to the classical static electric polarizability $\alpha_{cl}$ of a metal sphere $$\alpha_{cl} = 4\pi\in_o R^3. \quad (2.12b)$$

This solution of electrostatics applies as well to small metal spheres in the oscillating electromagnetic fields in the quasi-static regime. This regime is characterized by keeping the time but not the spatial dependence of the electromagnetic field. The spheres then feel a field with spatially constant—though time dependent—phase. In this approximation excitations due to the magnetic field do not occur. $\in$ and $\in_m$ in (2.11) and (2.12a) have then just to be replaced by their frequency dependent values $\in(\omega)$ and $\in_m(\omega)$. Usually $\in_n$, is taken as a real constant throughout the visible and it is possible to find a resonance frequency. The internal electric field of (2.11) as well as the polarizability of (2.12a) show resonance behavior whenever $$|\in + 2\in_m| = \text{Minimum}, \quad (2.13a)$$

i.e.

$$[\in_1(\omega) + 2\in_m]^2 + [\in_2(\omega)]^2 = \text{Minimum}. \quad (2.13b)$$

This means that a negative $\in_1$ is necessary which guarantees the proper phase relation between field and cluster polarization. Only in the special cases of small $\in_2(\omega)$ ($E_2 \ll 1$) or a small frequency dependence $\partial \in_2/\partial \omega$, the resonance frequency can be established from the common relation $$\in_1 = -2\in_m. \quad (2.13c)$$

Using the approximative equation for free-electron metals and $\in_m=1$, we find the resonance position $$\omega_1 = \frac{\omega_p}{\sqrt{3}}, \quad (2.14a)$$

or inserting (2.12b) at the frequency $$\omega_1 = \sqrt{\frac{Ne^2}{m_e \alpha_{cl}}}, \quad (2.14B)$$

where N denotes the total number of conduction electrons in the sphere. The latter equation is peculiar in relating the optical resonance to the static polarizability.

It is interesting to note that the same polarizability as well as the Drude eigenfrequency for free electron clusters has been calculated with a simple oscillator model as for the Thomson model of the atom. The displacement of the negative charges due to an electric field gives rise to polarization charges at the cluster surface and hence to a linear restoring force which determines the finite eigenfrequency (2.14a) of the system. Thus, the conduction electrons in a spherical cluster act like an oscillator system, whereas in bulk material they behave like a relaxator system (the Drude frequency $\omega_p$ is not excited by light in the bulk!). We note that the problem of the eigenfrequency of a spherical Fermi fluid was already solved by Jensen in 1937.

Another numerical estimate for the resonance frequency in Drude metal clusters can be found by expressing the sphere volume in terms of the Wigner-Seitz radius $r_s$. This is the radius of a sphere whose volume is equal to the volume per conduction electron in the bulk, i.e. $R=r_s N^{1/3}$. Thus it follows from (2.12b) and (2.14b)

$$\omega_1 = \sqrt{\frac{e^2}{m_e 4\pi\varepsilon_0 r_s^3}}. \quad (2.14c)$$

With $r_s=3.93$ a.u. (=0.208 nm) for Na, the resonance wavelength is $\lambda_1=355$ nm. Sometimes $\omega_1$ of (2.14) is interpreted as the classical surface plasmon frequency. The term surface stems from the fact that, although all electrons are oscillating with respect to the positive-ion background, the main effect producing the restoring force is the surface polarization. The latter is due to charges within the electronic screening length which amounts to about one atomic distance in good metals. This description can easily be extended to metal spheroids or ellipsoids. For example, ellipsoids with three different axes have three principal axes of the polarizability tensor, i.e. three different eigenfrequencies.

While Photon-Electron resonance has been discussed in detail, it is further contemplated that various other effects, alone or in any combination, may be contributing to the very localized, specific heat generation methodologies discussed above. These may include landau damping, electron hole creation/dynamics as well as phonon lattice vibrations, in any combination and contribution.

It is also understood that the examples and implementations described herein are for illustrative purposes only and that various modifications or changes in light thereof will be suggested to persons skilled in the art and are to be included within the spirit and purview of this application and scope of the appended claims and combinations thereof.

What is claimed is:

1. A method for facilitating catalytic chemical reactions utilizing Photon-Electron resonance derived localized heating, comprising:
   providing a substrate having disposed thereon at least one metal nanoparticle;
   introducing at least one reactant adjacent said metal nanoparticle at a proximal portion of the substrate, wherein said at least one reactant is a liquid;
   irradiating said metal nanoparticle with electromagnetic radiation, wherein said electromagnetic radiation has a predetermined frequency or range of frequencies and an energy of between about 0.5-4 eV;
   exciting at least a Photon-Electron resonance of said metal nanoparticle;
   providing localized heat, from said metal nanoparticle and as a result of said at least Photon-Electron resonance, at a catalytic chemical reaction temperature to facilitate at least one catalytic chemical reaction involving said least one reactant;
   generating at least one reaction product; and
   removing and recovering the at least one reaction product at a distal portion of the substrate.

2. A method for facilitating catalytic chemical reactions utilizing Photon-Electron resonance derived localized heating, comprising:
   providing a substrate having disposed thereon at least one metal nanoparticle;
   introducing at least one reactant adjacent said metal nanoparticle at a proximal portion of the substrate, wherein said at least one reactant is a plasma or a gas;
   irradiating said metal nanoparticle with electromagnetic radiation, wherein said electromagnetic radiation has a predetermined frequency or range of frequencies and an energy of between about 0.5-4 eV;
   exciting at least a Photon-Electron resonance of said metal nanoparticle;
   providing localized heat, from said metal nanoparticle and as a result of said at least Photon-Electron resonance, at a catalytic chemical reaction temperature to facilitate at least one catalytic chemical reaction involving said least one reactant;
   generating at least one reaction product; and
   removing and recovering the at least one reaction product at a distal portion of the substrate.

3. A method for facilitating catalytic chemical reactions utilizing Photon-Electron resonance derived localized heating, comprising:
   providing a substrate having disposed thereon at least one metal nanoparticle;
   introducing at least one reactant adjacent said metal nanoparticle at a proximal portion of the substrate, wherein said at least one reactant is a solid;
   irradiating said metal nanoparticle with electromagnetic radiation, wherein said electromagnetic radiation has a predetermined frequency or range of frequencies and an energy of between about 0.5-4 eV;
   exciting at least a Photon-Electron resonance of said metal nanoparticle;
   providing localized heat, from said metal nanoparticle and as a result of said at least Photon-Electron resonance, at a catalytic chemical reaction temperature to facilitate at least one catalytic chemical reaction involving said least one reactant;

generating at least one reaction product; and
removing and recovering the at least one reaction product at a distal portion of the substrate.

4. A method for facilitating catalytic chemical reactions utilizing Photon-Electron resonance derived localized heating, comprising:
providing a substrate having disposed thereon at least one metal nanoparticle;
introducing at least one reactant adjacent said metal nanoparticle at a proximal portion of the substrate, wherein said at least one reactant is a compound having a particular ratio of elements in said compound, irradiating said metal nanoparticle with electromagnetic radiation, wherein said electromagnetic radiation has a predetermined frequency or range of frequencies and an energy of between about 0.5-4 eV;
exciting at least a Photon-Electron resonance of said metal nanoparticle;
providing localized heat, from said metal nanoparticle and as a result of said at least Photon-Electron resonance, at a catalytic chemical reaction temperature to facilitate at least one catalytic chemical reaction involving said least one reactant;
generating at least one reaction product, wherein said at least one reaction product has the same ratio of elements as said compound and said at least one catalytic chemical reaction results in a change of at least one characteristic of said compound; and
removing and recovering the at least one reaction product at a distal portion of the substrate.

5. The method of claim 4, wherein said change of at least one characteristic is selected from the group consisting of re-arrangement of atoms, change in bond number, change in bond type, change in bond angle and any combination thereof.

6. The method of claim 4, wherein said change of at least one characteristic results in isomer production of said at least one reactant.

7. The method of claim 6, wherein said isomer production includes production of enantiomers.

8. A method for facilitating chemical reactions utilizing localized heating, comprising:
providing a substrate having disposed thereon a plurality of metal nanoparticles;
introducing at least one reactant adjacent said plurality of metal nanoparticles at a proximal portion of the substrate, wherein said at least one reactant is a liquid;
irradiating said plurality of metal nanoparticles with electromagnetic radiation, wherein said electromagnetic radiation has a pre-determined frequency or range of frequencies and an energy of between about 0.5-4 eV;
exciting at least a Photon-Electron resonance of said plurality of metal nanoparticles;
providing localized heat, from said plurality of metal nanoparticles and as a result of said at least Photon-Electron resonance, at a chemical reaction temperature to facilitate at least one chemical reaction involving said least one reactant;
providing at least one reaction product; and
removing and recovering the at least one reaction product at a distal portion of the substrate.

9. A method for facilitating chemical reactions utilizing localized heating, comprising:
providing a substrate having disposed thereon a plurality of metal nanoparticles;
introducing at least one reactant adjacent said plurality of metal nanoparticles at a proximal portion of the substrate, wherein said at least one reactant is a plasma or a gas;
irradiating said plurality of metal nanoparticles with electromagnetic radiation, wherein said electromagnetic radiation has a pre-determined frequency or range of frequencies and an energy of between about 0.5-4 eV;
exciting at least a Photon-Electron resonance of said plurality of metal nanoparticles;
providing localized heat, from said plurality of metal nanoparticles and as a result of said at least Photon-Electron resonance, at a chemical reaction temperature to facilitate at least one chemical reaction involving said least one reactant;
providing at least one reaction product; and
removing and recovering the at least one reaction product at a distal portion of the substrate.

10. A method for facilitating chemical reactions utilizing localized heating, comprising:
providing a substrate having disposed thereon a plurality of metal nanoparticles;
introducing at least one reactant adjacent said plurality of metal nanoparticles at a proximal portion of the substrate, wherein said at least one reactant is a solid;
irradiating said plurality of metal nanoparticles with electromagnetic radiation, wherein said electromagnetic radiation has a pre-determined frequency or range of frequencies and an energy of between about 0.5-4 eV;
exciting at least a Photon-Electron resonance of said plurality of metal nanoparticles;
providing localized heat, from said plurality of metal nanoparticles and as a result of said at least Photon-Electron resonance, at a chemical reaction temperature to facilitate at least one chemical reaction involving said least one reactant;
providing at least one reaction product; and
removing and recovering the at least one reaction product at a distal portion of the substrate.

11. A method for facilitating chemical reactions utilizing localized heating, comprising:
providing a substrate having disposed thereon a plurality of metal nanoparticles, wherein said plurality of metal nanoparticles is comprised of at least a first subset and a second subset of metal nanoparticles, each subset differing in composition from another subset;
introducing at least one reactant adjacent said plurality of metal nanoparticle at a proximal portion of the substrate;
irradiating said plurality of metal nanoparticles with electromagnetic radiation, wherein said electromagnetic radiation has a pre-determined frequency or range of frequencies and an energy of between about 0.5-4 eV;
exciting at least a Photon-Electron resonance of said plurality of metal nanoparticles;
providing localized heat, from said plurality of metal nanoparticles and as a result of said at least Photon-Electron resonance, at a chemical reaction temperature to facilitate at least one chemical reaction involving said least one reactant;
providing at least one reaction product; and
removing and recovering the at least one reaction product at a distal portion of the substrate;
further comprising the step of providing additional electromagnetic radiation, wherein the additional electromagnetic radiation has a pre-determined frequency or range of frequencies that differs from the electromagnetic radiation and excites at least a Photon-Electron resonance in said second subset of metal nanoparticles and thus provides heat for an additional chemical reaction.

12. A method for facilitating chemical reactions utilizing localized heating, comprising:
providing a substrate having disposed thereon a plurality of metal nanoparticles;
introducing at least one reactant adjacent said plurality of metal nanoparticles at a proximal portion of the substrate;
irradiating said plurality of metal nanoparticles with electromagnetic radiation, wherein said electromagnetic radiation has a pre-determined frequency or range of frequencies and an energy of between about 0.5-4 eV;
exciting at least a Photon-Electron resonance of said plurality of metal nanoparticles;
providing localized heat, from said plurality of metal nanoparticles and as a result of said at least Photon-Electron resonance, at a chemical reaction temperature to facilitate at least one chemical reaction involving said least one reactant wherein the localized heat is provided, at least in part, by at least one of phonon lattice vibrations, electron hole creation/dynamics, Landau damping, or any combination thereof, in addition to said Photon-Electron resonance;
providing at least one reaction product; and
removing and recovering the at least one reaction product at a distal portion of the substrate.

13. The method of claim 1 wherein the electromagnetic radiation comprises incoherent electromagnetic radiation.

14. The method of claim 1 wherein the at least one metal nanoparticle comprises at least one of gold, copper, or silver.

15. The method of claim 1 wherein the at least one reaction product comprises a gas.

16. The method of claim 8 wherein the at least one metal nanoparticle comprises at least one of gold, copper, or silver.

17. The method of claim 8 wherein the at least one reaction product comprises a gas.

18. The method of claim 12 wherein the plurality of metal nanoparticles comprises at least one of gold, copper, or silver.

* * * * *